United States Patent [19]
Sato et al.

[11] Patent Number: 5,702,846
[45] Date of Patent: Dec. 30, 1997

[54] PHOTOSENSITIVE COMPOSITION FOR VOLUME HOLOGRAM RECORDING

[75] Inventors: Akihiko Sato; Kenzo Mizutani, both of Suita; Masami Kawabata, Katano; Iwao Sumiyoshi, Osaka, all of Japan

[73] Assignee: Nippon Paint Co. Ltd., Osaka, Japan

[21] Appl. No.: 808,546

[22] Filed: Feb. 28, 1997

Related U.S. Application Data

[63] Continuation of Ser. No. 536,103, Sep. 29, 1995, abandoned.

[30] Foreign Application Priority Data

Oct. 3, 1994 [JP] Japan ................ 6-238927

[51] Int. Cl.⁶ ................ G03C 1/73; G03H 1/02
[52] U.S. Cl. ................ 430/2; 430/1; 430/290; 430/280.1; 430/281.1; 430/286.1; 359/3; 522/172; 522/91; 522/92
[58] Field of Search ................ 430/1, 2, 290, 430/945, 280.1, 281.1, 286.1; 522/4, 91, 92, 172; 359/1, 3

[56] References Cited

U.S. PATENT DOCUMENTS

| | | | |
|---|---|---|---|
| 4,576,999 | 3/1986 | Eckberg | 525/476 |
| 4,699,802 | 10/1987 | Nakos et al. | 522/99 |
| 4,849,320 | 7/1989 | Irving et al. | 522/4 |
| 5,453,340 | 9/1995 | Kawabata et al. | 522/4 |

FOREIGN PATENT DOCUMENTS 0487086  5/1992  European Pat. Off.

OTHER PUBLICATIONS

Kirk–Othmer Encyclopedia or Polymers Science and Technology (vol. 15, pp. 204–207) (1989).
Kawabata et al. Appl. Opt. 33(11) pp. 2152–2155 (Apr. 1994).

*Primary Examiner*—Martin Angebranndt
*Attorney, Agent, or Firm*—Wenderoth, Lind & Ponack

[57] ABSTRACT

The present invention provides a photosensitive composition for volume hologram recording, comprising the following components:

(A) a cationic polymerizable compound and a radical polymerizable compound,
(B) a cationic polymerization initiating material, and
(C) a radical polymerization initiating material, as an essential component, wherein at least one of the cationic polymerizable compound and radical polymerizable compound of the component contains a siloxane group, and a difference in refractive index between the cationic polymerizable compound and radical polymerizable compound is not less than 0.01.

4 Claims, 1 Drawing Sheet

PHOTOSENSITIVE COMPOSITION FOR VOLUME HOLOGRAM RECORDING

This application is a continuation of now abandoned application, Ser. No. 08/536,103, filed Sep. 29, 1995, now abandoned.

BACKGROUND OF THE INVENTION

The present invention relates to a photosensitive composition for volume hologram recording, which affords a hologram which is superior in refractive index modulation, light resistance, heat resistance, etc., a hologram recording medium using the same, a process for recording a volume hologram, and a recorded hologram.

A hologram is obtained by recording a wave front of object light as an interference fringe which is formed by interfering two kinds of lights having the same wavelength (object light and reference light) on a photosensitive material. When light having the same condition as that of the original reference light is irradiated to the hologram, a diffraction phenomenon due to the interference fringe arises, and the same wave front as that of the original object light can be reproduced.

The hologram can be classified into some kinds according to a recording form of the interference fringe. Recently, the so-called hologram for recording the interference fringe according to a difference in refractive index in the interior of a recording layer has been applying for the use such as three-dimensional display, optical element and the like because of it's high diffraction efficiency and excellent wavelength selectivity.

As a photosensitive material for recording such a volume hologram, those comprising silver halide or gelatin bichromate which have hitherto been used in the fields of art are popular. However, these are not suitable for manufacturing the hologram industrially because a wet development and a complicated developing/fixing treatment are required. Further, there is a problem that the resulting image after recording disappears due to moisture absorption.

In order to overcome the above problem of a conventional technique, U.S. Pat. Nos. 3,658,526 and 3,993,485 suggest to prepare a volume hologram only by a simple dry treatment using a photopolymer. Further, an estimated formation mechanism of the hologram due to the photopolymer is studied in "APPLIED OPTICS", B. L. Booth, Vol. 14, No. 3, pages 593–601 (1975); and W. J. Tomlinson, E. A. Chandross et al., Vol. 15, No. 2, pages 534–541 (1976). However, these original techniques could not hardly compete with the above-described technique in view of refractive index modulation which is particularly important performance.

There have recently been proposed photopolymer materials having an excellent refractive index modulation, such as material utilizing a difference in refractive index between a binder polymer and a radical polymerizable compound described in U.S. Pat. Nos. 4,942,102 and 4,942,112, material utilizing a difference in refractive index and reactivity between specific two radical polymerizable compounds described in Japanese Laid-Open Patent publication No. 3-249685, material using a radical polymerizable compound and a radical polymerizable compound, which are different in refractive index, described in Japanese Patent Application No. 5-107999, etc. It became possible to make a volume hologram having a comparatively large refractive index modulation by subjecting to a dry treatment using these photopolymer materials, however, it is not sufficient at present. Furthermore, there has been required to develop a volume hologram having light and heat resistances enough to bear using outdoors.

SUMMARY OF THE INVENTION

The present invention relates to a photosensitive composition for volume hologram recording, which is used for recording an interference fringe produced by the interference of laser beam or light having excellent coherence as a fringe having a different refractive index, said composition comprising the following components:

(A) a cationic polymerizable compound and a radical polymerizable compound, (B) a cationic polymerization initiating material, and (C) a radical polymerization initiating material, as an essential component, wherein at least one of the cationic polymerizable compound and radical polymerizable compound of the component (A) contains a siloxane bond.

DETAILED DESCRIPTION OF THE INVENTION

Figure 1:
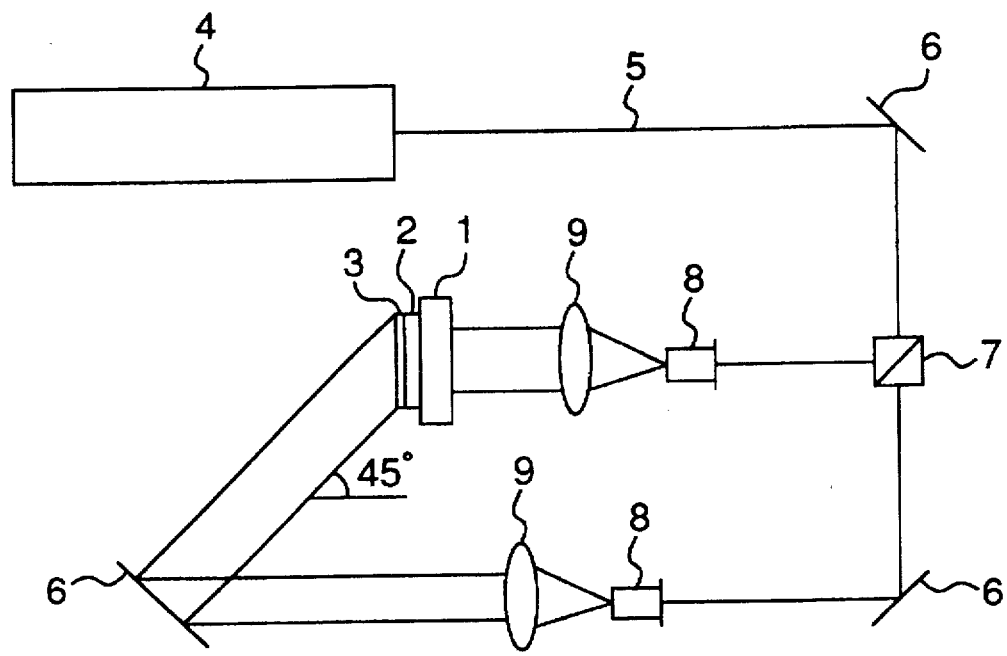
FIG. 1 is a schematic diagram illustrating a recording method of a reflection type hologram in the first exposure.

An object of the present invention is to provide a photosensitive composition for volume hologram recording, which affords a hologram which is superior in refractive index modulation, light resistance, heat resistance, etc., and a process for producing a volume hologram using the same.

The present invention relates to a photosensitive composition for volume hologram recording, which is used for recording an interference fringe produced by the interference of laser beam or light having excellent coherence as a fringe having a different refractive index, said composition comprising the following components:

(A) a cationic polymerizable compound and a radical polymerizable compound, (B) a cationic polymerization initiating material, and (C) a radical polymerization initiating material, as an essential component, wherein at least one of the cationic polymerizable compound and radical polymerizable compound of the component (A) contains a siloxane group.

Furthermore, the present invention relates to a volume hologram recording medium comprising a recording layer of the above composition between the same or different two transparent substrates.

Furthermore, the present invention relates to a process for recording a volume hologram, which comprises exposing the above recording medium to an interference fringe produced by the interference of laser beam or light having excellent coherence, and carrying out the irradiation of ultraviolet light and/or light in the visible range on the total surface of the recording medium and heat treatment of the recording medium, simultaneously or successively.

Furthermore, the present invention relates to a volume hologram recorded according to the above process.

The cationic polymerizable compound to be used in the present invention may be those which are superior in compatibility with other component such as a radical polymerizable compound having a siloxane group, etc. and polymerized by a Brønsted or Lewis acid generated from a cationic polymerization initiator. This cationic polymerizable compound may have a siloxane group.

Examples of the cationic polymerizable compound include diglycerol polyglycidyl ether, pentaerythritol polyglycidyl ether, 1,4-bis(2,3-epoxypropoxyperfluoroisopropyl) cyclohexane, sorbitol polyglycidyl ether, trimethylolpropane polyglycidyl ether, resorcin diglycidyl ether, 1,6-hexanediol diglycidyl ether, polyethylene glycol diglycidyl ether, phenyl glycidyl ether, paratertiary butylphenyl glycidyl ether, diglycidyl adipate, diglicidyl orthophthalate, dibromophenyl glycidyl ether, dibromoneopentyl glycol diglycidyl ether, 1,2,7,8-diepoxyoctane, 1,6-dimethylolperfluorohexane diglycidyl ether, 4,4'-bis (2,3-epoxypropoxyperfluoroisopropyl)diphenyl ether, 3,4-epoxycyclohexylmethyl-3',4'-epoxycyclohexane carboxylate, 3,4-epoxycyclohexyloxirane, 1,2,5,6-diepoxy-4,7-methanoperhydroindene, 2-(3,4-epoxycyclohexyl)-3',4'-epoxy-1,3-dioxane-5-spirocyclohexane, 1,2-ethylenedioxy-bis(3,4-epoxycyclohexylmethane), 4',5'-epoxy-2'-methylcyclohexylmethyl-4,5-epoxy-2-methylcyclohexane carboxylate, ethylene glycol-bis(3,4-epoxycyclohexane carboxylate), bis-(3,4-epoxycyclohexylmethyl)adipate, di-2,3-epoxycyclopentyl ether, vinyl-2-chloroethyl ether, vinyl-n-butyl ether, triethylene glycol divinyl ether, 1,4-cyclohexanedimethanol divinyl ether, trimethylolethane trivinyl ether, vinyl glycidyl ether and compounds represented by the formula:

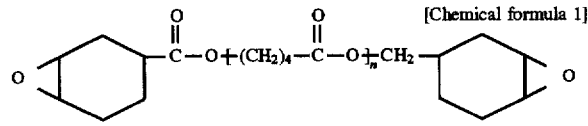

[Chemical formula 1]

wherein n is an integer of 1 to 5, and the formula:

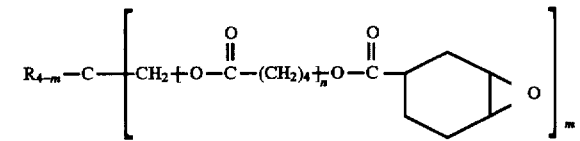

wherein m is 3 or 4, R is an ethyl group or a hydroxymethyl group and n is as defined above. One or more sorts of them may be used.

The cationic polymerizable compound having a siloxane group to be used in the present invention is represented by the following formula (I):

[Chemical formula 2]

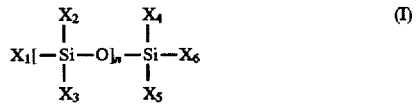

In the formula (I), at least one of $X_1$ to $X_6$ has a cationic polymerizable group at the terminal end. $X_1$ to $X_6$ are the same or different and indicate a hydrogen atom, an alkyl group having 1 to 4 carbon atoms, an alkoxy group having 1 to 4 carbon atoms, a dialkylamino group, a phenyl group or a hydroxyl group. Preferably, n is an integer of 1 to 7. In addition, the cationic polymerizable group and a silicon atom may bond together through an alkyl chain, an oxyethylene chain, an oxypropylene chain, an urethane chain or an amide bond. Examples of the cationic polymerizable group include glycidyl group, cyclic ether (e.g. alicyclic epoxy group, etc.), cyclic sulfide, cyclic imine, cyclic disulfide, lactone, lactam, cyclic formal, cyclic imino ether, vinyl ether, etc.

The radical polymerizable compound to be used in the present invention may be those which are superior in compatibility with the cationic polymerizable compound having a siloxane group and polymerized by active radical species generated from a radical polymerization initiator. This radical polymerizable compound may have a siloxane group. The radical polymerizable compound having at least one ethylenically unsaturated double bond is preferred. Examples of the radical polymerizable compound include acrylamide, methacrylamide, styrene, 2-bromostyrene, phenyl acrylate, 2-phenoxyethyl acrylate, 2,3-naphthalenedicarboxylic acid (acryloxyethyl) monoester, methylphenoxyethyl acrylate, nonylphenoxyethyl acrylate, β-acryloxyethyl hydrogen phthalate, phenoxypolyethylene glycol acrylate, 2,4,6-tribromophenyl acrylate, diphenic acid (2-methacryloxyethyl) monoester, bezyl acrylate, 2,3-dibromopropyl acrylate, 2-hydroxy-3-phenoxypropyl acrylate, 2-naphthyl acrylate, N-vinylcarbazole, 2-(9-carbazolyl)ethyl acrylate, triphenylmethylthio acrylate, 2-(tricyclo[5,2,10$^{2,6}$]dibromodecylthio)ethyl acrylate, S-(1-naphthylmethyl)thioacrylate, dicyclopentanyl acrylate, methylenebisacrylamide, polyethylene glycol diacrylate, trimethylolpropane triacrylate, pentaerythrithol triacrylate, diphenic acid (2-acryloxyethyl) (3-acryloxypropyl-2-hydroxy)diester, 2,3-naphthalinedicarboxylic acid (2-acryloxyethyl) (3-acryloxypropyl-2-hydroxy)diester, 4,5-phenanthrenedicarboxylic acid (2-acryloxyethyl) (3-acryloxypropyl-2-hydroxy)diester, dibromoneopentyl glycol diacrylate, dipentaerythritol hexaacrylate, 1,3-bis[2-acryloxy-3-(2,4,6-tribromophenoxy)propoxy] benzene, diethylenedithio glycol diacrylate, 2,2-bis(4-acryloxyethoxyphenyl)propane, bis(4-acryloxydiethoxyphenyl)methane, bis(4-acryloxyethoxy-3,5-dibromophenyl)methane, 2,2-bis(4-acryloxyethoxyphenyl)propane, 2,2-bis(4-acryloxydiethoxyphenyl)propane, 2,2-bis(4-acryloxyethoxy-3,5-dibromophenyl)propane, bis(4-acryloxyethoxyphenyl)sulfon, bis(4-acryloxydiethoxyphenyl)sulfon, bis(4-acryloxypropoxyphenyl)sulfon, bis(4-acryloxyethoxy-3,5-dibromophenyl)sulfone, compounds wherein the above acrylate is substituted with methacrylate, ethylenically unsaturated double bond-containing compounds having at least two S atoms in the molecule as described in Japanese Laid-Open Patent Publication Nos. 2-247205 and 2-261808, etc. On or more sorts of them may be used.

The radical polymerizable compound having a siloxane group to be used in the present invention is represented by the following formula (II):

[Chemical formula 3]

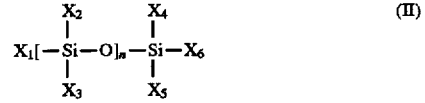

In the formula (II), at least one of $X_1$ to $X_6$ has a radical polymerizable group at the terminal end. $X_1$ to $X_6$ are the same or different and indicate a hydrogen atom, an alkyl group having 1 to 4 carbon atoms, an alkoxy group having 1 to 4 carbon atoms, a dialkylamino group, a phenyl group or a hydroxyl group. Preferably, n is an integer of 1 to 7. In addition, the cationic polymerizable group and a silicon atom may bond together through an alkyl chain, an oxyethylene chain, an oxypropylene chain, an urethane chain or an amide bond. As the radical polymerizable group, there is a group having an ethylenically unsaturated double bond. Examples thereof include acryloyl group, methacryloyl group and vinyl group.

The cationic polymerization initiating material of the component (B) to be used in the present invention may be an initiating material which can initiate the polymerization of the cationic polymerizable compound by an action of light or heat. Examples of the cationic polymerization initiating material of the component (B) include those described in "UV Curing: Science and Technology", page 23 to 76, edited by S. Peter Pappas, A Technology Marketing Publication; and "Coments Inorg. Chem.", B Klingert, M. Riediker and A. Roloff, Vol. 7, No. 3, Pages 109 to 138 (1988). One or more sorts of them may be used.

As the particularly preferred cationic photopolymerization initiating material of the component (B) to be used in the present invention, there are diaryl iodonium salts, triaryl sulfonium salts, iron-allene complexes, etc.

Preferred examples of the diaryl iodonium salts as the cationic polymerization initiating material of the component (B) include tetrafluoroborate, hexafluorophosphate, hexafluoroarsenate, hexafluoroantimonate, trifluoromethanesulfonate, 9,10-dimethoxyantrasulfonate, etc. of iodonium described in the radical photopolymerization initiating material of the component (C) described hereinafter. Preferred examples of the triarylsulfonium salts include tetrafluoroborate, hexafluorophosphate, hexafluoroarsenate, hexafluoroantimonate, trifluoromethanesulfonate, 9,10-dimethoxyantrasulfonate, etc. of sulfonium, e.g. triphenylsulfonium, 4-tertiary butyltriphenylsulfonium, tris(4-methylphenyl)sulfonium, tris(4-methoxyphenyl)sulfonium, 4-thiophenyltriphenylsulfonium, etc.

When the interference fringe is recorded by the polymerization reaction of the cationic polymerizable compound, a cationic polymerization initiating material, which can form a Brønsted or Lewis acid by irradiating laser beam having a specific wavelength or light having excellent coherence to polymerize the cationic polymerizable compound, is used. Examples of the cationic polymerization initiating material include combinations of acridine pigments (e.g. acridine orange, acridine yellow, etc.) or benzothiazolium pigments (e.g. Setoflavin t, etc.) with diaryl iodoniums or triaryl sulfoniums, etc.

As the radical polymerization initiating material of the component (C) to be used in the present invention may be an initiating material which can initiate the polymerization of the radical polymerizable compound by an action of light or heat. When the interference fringe is recorded by the polymerization reaction of the radical polymerizable compound, a radical polymerization initiating material, which can form active radical species by irradiating laser beam or light having excellent coherence to polymerize the radical polymerizable compound, is used. Examples of the radical polymerization initiating material include known initiating materials described in U.S. Pat. Nos. 4,766,055, 4,868,092 and 4,965,171, Japanese Laid-Open Publication Nos. 54-151024, 58-15503, 58-29803, 59-189340, 60-76735 and 1-28715, Japanese Patent Application No. 3-5569, "PROCEEDINGS OF CONFERENCE ON RADIATION CURING ASIA", page 461–477 (1988) and the like, but are not limited thereto.

The term "initiating material" used in this specification means that a sensitizer which is normally the component absorbing light can be used in combination with an active radical generating compound or an acid generating compound. As the sensitizer in the radical polymerization initiating material, a colored compound such as a dye is used popularly so as to absorb visible laser beam, however, when transparency is required for the final hologram (e.g. the use for head-up display of automobile, etc.), cyanine dyes disclosed in Japanese Laid-Open Patent Publication Nos. 58-29803 and 1-287105 and Japanese Patent Application No. 3-5569 are used, preferably. The cyanine dye is normally liable to be decomposed by light and, therefore, the dye in the hologram is decomposed by the post exposure or by allowing to stand under room light or sunlight for several hours to several days, which results in no absorption at a visible light range. Thus, a transparent hologram can be obtained. Examples of the cyanine dye include anhydro-3, 3'-dicarboxymethyl-9-ethyl-2,2'-thiacarbocyanine betaine, anhydro-3-carboxymethyl-3',9'-diethyl-2,2'-thiacarbocyanine betaine, 3,3',9-triethyl-2,2'-thiacarbocyanine iodine salt, 3,9-diethyl-3'-carboxymethyl-2,2'-thiacarbocyanine iodine salt, 3,3',9-triethyl-2,2-(4,5,4',5'-dibenzo) thiacarbocyanine iodine salt, 2-[3-(3-ethyl-2-benzothiazolidene)-1-propenyl]-6-[2-(3-ethyl-2-benzothiazolidene)ethylideneimino]-3-ethyl-1,3,5-thiadiazolium iodine salt, 2-[[3-allyl-4-oxo-5-(3-n-propyl-5,6-dimethyl-2-benzothiazolidene)-ethylidene-2-thiazolinylidene]methyl]3-ethyl-4,5-diphenylthiazolinium iodine salt, 1,1',3,3,3',3'-hexamethyl-2,2'-indotricarbocyanine iodine salt, 3,3'-diethyl-2,2'-thiatricarbocyanine perchlorate, anhydro-1-ethyl-4-methoxy-3'-carboxymethyl-5'-chloro-2,2'-quinothiacyanine betaine, anhydro-5,5'-diphenyl-9-ethyl-3,3'-disulfopropyloxacarbocyanine hydroxide triethylamine salt and the like. One or more sorts of them may be used.

As the active radical generating compound which may be used in combination with the cyanine dye, for example, there are diaryl iodonium salts disclosed in the above-described Japanese Laid-Open Patent Publication Nos. 58-29803 and 1-287105 and Japanese Patent Application No. 3-5569, or 2,4,6-substituted-1,3,5-triazines. When high photosensitivity is required, it is particularly preferred to use diaryl iodonium salts, preferably. Examples of diaryl iodonium salts include chloride, bromide, tetrafluoroborate, hexafluorophosphate, hexafluoroaresenate, hexafluoroantimonate, trifluoromethanesulfonate and 9,10-dimethoxyanthracene-2-sulfonate of diphenyl iodonium, 4,4'-dichlorodiphenyl iodonium, 4,4'-dimethoxydiphenyl iodonium, 4,4'-ditertiary butyldiphenyl iodonium, 3,3'-dinitrodiphenyl iodonium and the like. Further, examples of 2,4,6-substituted-1,3,5-triazines include 2-methyl-4,6-bis(trichloromethyl)-1,3,5-triazine, 2,4,6-tris(trichloromethyl)-1,3,5-triazine, 2-phenyl-4,6-bis(trichloromethyl)-1,3,5-triazine, 2,4-bis(trichloromethyl)-6-(p-methoxyphenylvinyl)-1,3,5-triazine,2-(4'-methoxy-1'-naphthyl)-4,6-bis (trichloromethyl)-1,3,5-triazine and the like.

The combination of each component in the photosensitive composition for volume hologram recording of the present invention is as follows. That is, the amount of the cationic polymerizable compound, cationic polymerizable compound having a siloxane group, radical polymerizable compound and radical polymerizable compound having a siloxane group as the component (A) is 2 to 70% by weight (more preferably 35 to 65% by weight), 2 to 70% by weight (more preferably 10 to 45% by weight), 20 to 90% by weight (more preferably 40 to 80% by weight) and 20 to 90% by weight (more preferably 35 to 65% by weight), respectively. The amount of the cationic polymerization initiating material as the component (B) and radical polymerization initiating material as the component (C) is 0.3 to 8% by weight (more preferably 1 to 5% by weight) and 0.3 to 8% by weight (more preferably 1 to 5% by weight), respectively. It is necessary that a difference in refractive index between the cationic polymerizable compound and radical polymerizable compound as the component (A) is not less than 0.01, when the difference is not more than 0.01, the refractive index modulation value of the recorded hologram is small and a bright hologram can not be obtained.

Additives such as polymer binders, thermal polymerization inhibitors, silane coupling agents, leveling agents, antifoam, colorants, etc. may be optionally formulated in the photosensitive composition for volume hologram recording of the present invention. They may be used in combination.

It is necessary that the polymer binder has a good compatibility with the component (A) to be used in the present invention. Examples thereof include chlorinated polyethylene, polystyrene, acrylic resin (homopolymer or copolymer of acrylate), methacrylci acid (homopolymer or copolymer of methacrylate), polyvinyl acetate, polyvinyl formal, polyvinyl butyral, polyvinyl pyrrolidone, polyester, ethyl cellulose, acetyl cellulose, etc. The polymer binder may have a reactive group such as a cationic polymerizable group at the side chain or main chain thereof.

The photosensitive composition of the present invention may be prepared by a conventional method. For example, it can be prepared by formulating the above constituent components (A) to (C) in the absence or presence of solvents (e.g. ketone solvents such as methyl ethyl ketone, methyl isobutyl ketone, acetone, cyclohexanone, etc.; ester solvents such as ethyl acetate, butyl acetate, ethylene glycol diacetate, etc.; aromatic solvents such as toluene, xylene, etc.; cellosolve solvents such as methyl cellosolve, ethyl cellosolve, butyl cellosolve, etc.; alcohol solvents such as methanol, ethanol, propanol, n-butanol etc.; ether solvents such as tetrahydrofuran, dioxane, etc.; halogen solvents such as dichloromethane, dichloroethane, chloroform, etc.), followed by mixing in a dark place using a high-speed stirrer.

In the production of the hologram of the present invention, a recording layer can be formed by applying the above photosensitive composition on a transparent substrate such as glass plate, polyethylene terephthalate film, polyethylene film, triacetyl cellulose film and acrylic sheet, etc. according to a normal method, followed by drying optionally. A coating weight is selected appropriately, for example, a dry coating weight may be 1 to 50 g/m². Normally, a protective layer such as polyethylene terephthalate film, polyethylene film, polypropylene film, triacetyl cellulose film etc. is formed additionally on the recording layer to provide for the use. According to the other method for preparing a three-layer composite of which intermediate layer is a recording layer made of the composition of the present invention, a recording layer is firstly formed between two polyethylene terephthalate films, one of which is subjected to a releasing treatment, and then one of films are released on use to laminate the released surface on a suitable substrate. Further, the composition of the present invention can also be introduced between two glass plates.

In the recording layer thus prepared, an interference fringe is recorded in the interior thereof by a normal holography exposure equipment according to laser beam or light having excellent coherence (wavelength: 300 to 1200 nm). In the case of the composition of the present invention, diffraction light due to the recorded interference fringe can be obtained to afford a hologram at this stage. However, an unreacted polymerizable compound is remained in the photosensitive layer at this stage and, therefore, a film strength of the hologram can not be obtained, sometimes. Therefore, in order to polymerize the unreacted component remained in the photosensitive layer, the total surface of the hologram is exposed to light from a light source such as Xenon lamp, high-pressure mercury lamp, low-pressure mercury lamp, metal halide lamp, halogen lamp, etc. as the post exposure or subjected to a heat treatment to obtain a hologram having an excellent film strength of the present invention. In order to accelerate the polymerization of the unreacted monomer due to the heat treatment, organic peroxides such as benzoyl peroxide, etc. may be used in combination.

A larger refractive index modulation value can be obtained by subjecting a hologram to radical polymerization at the time of exposure of the interference fringe, and then subjecting to cationic polymerization at the time of the following exposure.

For the purpose, the combination of both initiating materials may be selected so that "the radical polymerization initiating material of the component (C) is a radical polymerization initiating material having a photosensitivity to laser beam or light having excellent coherence and the cationic polymerization initiating material of the component (B) is a cationic polymerization initiating material having a low photosensitivity to laser beam or light having excellent coherence and having a photosensitivity to light having another wavelength".

By treating the recording layer with heat or infrared light before the post exposure, diffraction efficiency, peak wavelength of diffraction light, half-width and the like can be changed.

For example, the above volume hologram can be used for lens, diffraction grating, interference filter, head-up display device, normal three-dimensional display, connector for optical fiber, optical polariscope for facsimile, memory material for ID card, constructional window glass, advertising medium and the like.

The reason why the refractive index modulation is improved by using the cationic or radical polymerizable compound having a siloxane group is not clear at present, but is assumed that it is caused by a weak interaction between molecules of the siloxane group. Considering the case that the radical polymerizable compound is polymerized at the light part of the interference fringe at the exposure stage of the interference fringe, an interaction between molecules of the cationic or radical polymerizable compound having a siloxane group is weak and, therefore, the radical or cationic polymerizable compound is liable to move from the dark part to light part of the interference fringe, thereby increasing the degree of separation between them. As a result, the refractive index modulation was improved.

According to the photosensitive composition for volume hologram recording of the present invention, a volume hologram having excellent diffraction efficiency, wavelength selectivity, refractive index modulation, light resistance and heat resistance can be produced easily.

[EXAMPLES]

The following Examples further illustrate the present invention in detail.

By using the photosensitive composition shown in the Examples and Comparative Examples described hereinafter, a test plate was prepared by the following method. Then, the resulting plate was exposed to light to obtain a hologram, and physical properties of the hologram was evaluated by the following method.

9

Production of the test plate

A predetermined amount of a radical photopolymerization initiating material component and a cationic photopolymerization initiating material component were dissolved or dispersed in a mixed solvent of n-butyl alcohol and methyl isobutyl ketone. To the resulting mixture, other components were added, followed by stirring and filtering to obtain a photosensitive solution. The photosensitive solution was applied on a glass plate of 16 cm×16 cm in size using an applicator, followed by drying at 90° C. for 5 minutes. A polyethylene film of 80 μm in thickness (LUPIC LI, manufactured by Tonen Kagaku Co., Ltd.) was laminated thereon using a roller for laminating to obtain a laminate which was cut into pieces of 3 cm×4 cm in size to give a test plate.

Exposure

Figure 2:
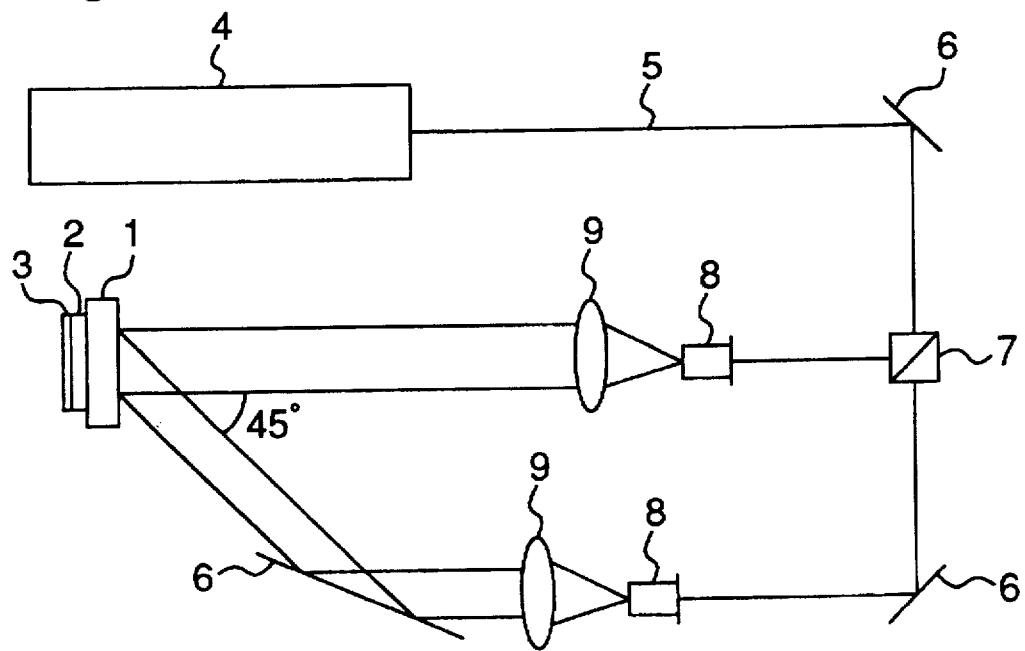
FIG. 2 is a schematic diagram illustrating a recording method of a transmission type hologram in the first exposure.

The first exposure was conducted using light (514.5 nm) from an argon ion laser. A schematic diagram illustrating a recording method of a reflection type hologram is shown in FIG. 1, and that of a transmission type hologram is shown in FIG. 2. A light intensity of one light flux on the surface of the test plate was 1.0 mW/cm$^2$ and an exposure time was 30 seconds in both cases.

After the completion of the first exposure, a post exposure was conducted by irradiating light of a high-pressure mercury lamp (laboratory ultraviolet light irradiation equipment FL-1001-2, manufactured by Nihon Denchi Co., Ltd) from the back of the polyethylene film for one minute.

Evaluation

A diffraction efficiency of the reflection type hologram was determined by measuring a reflectance of the hologram using a magnetic spectrophotometer UV-2100 manufactured by Shimazu Co. and an attachment integrating sphere reflector ISR-260. The diffraction efficiency of the transmission type hologram was determined by measuring a transmittance of the hologram using the above spectrophotometer. Further, a film thickness of the part of measurement for diffraction efficiency was measured using a film thickness measuring device Beta-scope 850 manufactured by Fischer Co. A refractive index modulation (half value of change in refractive index of interference fringe) was determined by calculating from the diffraction efficiency and film thickness thus obtained. The calculation formula described in "Coupled Wave Theory for Thick Hologram Gratings", H. Kogelnik, Bell Syst. Tech. J., Vol. 48, pages 2909–2947 (1969) was used. The value of refractive index modulation does not depend on the film thickness, and refractive index modulation capability can be compared by this value.

Regarding the light resistance, ultraviolet light having a wavelength from 295 to 450 nm was irradiated continuously to a test plate of a hologram for 60 hours using an ultra acceleration weatherometer I Super UV tester, W type, manufactured by Dainihon Plastic Co., Ltd. to examine a change in diffraction efficiency, a change in diffraction peak wavelength and yellowing of the test plate of the hologram.

Regarding the heat resistance, a hologram was allowed to stand in an incubator at 100° C. for 1000 hours to examine a change in diffraction efficiency, a change in diffraction peak wavelength and yellowing of the test plate of the hologram.

The following photosensitive composition of the Examples and Comparative Examples was prepared, and a hologram was prepared by the above method, respectively. The hologram was evaluated according to the same manner as that described above.

Examples 1 and 2

In these Examples, a reflection type hologram was produced using TSL9906 or XC96-B0370 (structural formulas of both compounds will be described hereinafter) as the cationic polymerizable compound having a siloxane group and using AEPM (structural formula will be described hereinafter) as the radical polymerizable compound which has a refractive index higher than the above compound and has no siloxane group. As the cationic photopolymerization initiating material, TPS•SbF$_6$ (the details will be described hereinafter) was used. As the radical photopolymerization initiating material, a combination of DYE-1 with DPI•TF (the details will be described hereinafter) was used.

The composition of the photosensitive compositions for hologram recording used in Examples 1 and 2 and evaluation results of the hologram are shown in Table 1 below. In all Examples, practical transparent reflection type holograms were obtained.

TABLE 2

| | Composition of photosensitive composition (mg) | | | | | | | Evaluation results of reflection type hologram | | |
|---|---|---|---|---|---|---|---|---|---|---|
| Example No. | Cationic polymerizable compound having silo- xane group | Radical polymer- izable compound | Cationic photopol- ymeriza- tion ini- tiating material | Radical photopo- lymeriz- ation initiat- ing ma- terial | Polymer binder | Differ- ence in refrac- tive index (*) | Solvent (mg) | Film thick- ness (μm) | Peak wave- length of diffrac- tion light (nm) | Diffrac- tion effi- ciency (%) | Refrac- tive index modula- tion |
| 1 | TSL9906: 300 | AEPM: 1500 | TPS.SbF$_6$: 80 | DYE-1: 5 DPI.TF: 60 | P-1: 500 | 0.087 | BuOH: 1500 MIBK: 1500 | 18.9 | 506 | 93 | 0.0147 |
| 2 | XC96- B0370: 300 | AEPM: 1500 | TPS.SbF$_6$: 80 | DYE-1: 5 DPI.TF: 60 | P-1: 500 | 0.065 | BuOH: 1500 MIBK: 1500 | 18.4 | 504 | 87 | 0.0126 |
| 3 | TSL9906: 500 | A-BPHE: 1300 | TPS.SbF$_6$: 80 | DYE-1: 5 DPI TF: 60 | P-1: 350 | 0.135 | BuOH: 1500 MIBK: 1500 | 19.6 | 510 | 97 | 0.0172 |

TABLE 2-continued

| Example No. | Composition of photosensitive composition (mg) | | | | | | | Evaluation results of reflection type hologram | | | |
|---|---|---|---|---|---|---|---|---|---|---|---|
| | Cationic polymerizable compound having siloxane group | Radical polymerizable compound | Cationic photopolymerization initiating material | Radical photopolymerization initiating material | Polymer binder | Difference in refractive index (*) | Solvent (mg) | Film thickness (μm) | Peak wavelength of diffraction light (nm) | Diffraction efficiency (%) | Refractive index modulation |
| 4 | XC96-B0370: 500 | A-BPHE: 1300 | TPS.SbF$_6$: 80 | DYE-1: 5 DPI.TF: 60 | P-1: 350 | 0.113 | BuOH: 1500 MIBK: 1500 | 19.2 | 512 | 96 | 0.0165 |
| 5 | TSL9906: 300 | AEPM: 1500 | TPS.SbF$_6$: 80 | DYE-1: 5 DPI.TF: 60 | — | 0.087 | BuOH: 1500 MIBK: 1500 | 18.4 | 505 | 84 | 0.0118 |
| 6 | XC96-B0370: 300 | AEPM: 1500 | TPS.SbF$_6$: 80 | DYE-1: 5 DPI.TF: 60 | — | 0.065 | BuOH: 1500 MIBK: 1500 | 17.8 | 506 | 76 | 0.0104 |

*Difference in refractive index between radical polymerization compound and cationic polymerization compound Examples 3 and 4

In these Examples, according to the same manner as that described in Examples 1 and 2 except for using A-BPHE (structural formula will be described hereinafter) as the radical polymerizable compound which has a refractive index higher than the cationic polymerizable compound having a siloxane group and which has no siloxane group, a test was carried out to produce a reflection type hologram.

The composition of the photosensitive compositions for hologram recording used in Examples 3 and 4 and evaluation results of the hologram are shown in Table 1 below. In all Examples, practical transparent reflection type holograms were obtained.

Examples 5 and 6

In these Examples, according to the same manner as that described in Examples 1 and 2 except for using no polymer binder P-1, a test was carried out to produce a reflection type hologram.

The composition of the photosensitive compositions for hologram recording used in Examples 5 and 6 and evaluation results of the hologram are shown in Table 1 below. In all Examples, practical transparent reflection type holograms were obtained.

Comparative Examples 1 to 4

These are Comparative Examples against Examples 1 to 4, which illustrate that performances of the resulting reflection type hologram are inferior to those of Examples 1 to 4 when using a cationic polymerizable compound containing no siloxane group in place of the cationic polymerizable compound having a siloxane group.

The composition of the photosensitive compositions used in Comparative Examples 1 to 4 and evaluation results of the hologram are shown in Table 2 below.

TABLE 2

| Comparative example No. | Composition of photosensitive composition (mg) | | | | | | | Evaluation results of reflection type hologram | | | |
|---|---|---|---|---|---|---|---|---|---|---|---|
| | Cationic polymerizable compound having no siloxane group | Radical polymerizable compound | Cationic photopolymerization initiating material | Radical photopolymerization initiating material | Polymer binder | Difference in refractive index (*) | Solvent (mg) | Film thickness (μm) | Peak wavelength of diffraction light (nm) | Diffraction efficiency (%) | Refractive index modulation |
| 1 | CAT-1: 300 | AEPM: 1500 | TPS.SbF$_6$: 80 | DYE-1: 5 DPI.TF: 60 | P-1: 500 | 0.077 | BuOH: 1500 MIBK: 1500 | 19.5 | 512 | 64 | 0.0077 |
| 2 | CAT-2: 300 | AEPM: 1500 | TPS.SbF$_6$: 80 | DYE-1: 5 DPI.TF: 60 | P-1: 500 | 0.041 | BuOH: 1500 MIBK: 1500 | 20.1 | 510 | 58 | 0.0069 |
| 3 | CAT-1: 500 | A-BPHE: 1300 | TPS.SbF$_6$: 80 | DYE-1: 5 DPI.TF: 60 | P-1: 350 | 0.125 | BuOH: 1500 MIBK: 1500 | 19.3 | 509 | 73 | 0.0090 |

TABLE 2-continued

| | Composition of photosensitive composition (mg) | | | | | | Evaluation results of reflection type hologram | | | |
|---|---|---|---|---|---|---|---|---|---|---|
| Comparative example No. | Cationic polymerizable compound having no siloxane group | Radical polymerizable compound | Cationic photopolymerization initiating material | Radical photopolymerization initiating material | Polymer binder | Difference in refractive index (*) | Solvent (mg) | Film thickness (μm) | Peak wavelength of diffraction light (nm) | Diffraction efficiency (%) | Refractive index modulation |
| 4 | CAT-3: 500 | A-BPHE: 1300 | TPS.SbF$_6$: 80 | DYE-1: 5 DPI.TF: 60 | P-1: 350 | 0.118 | BuOH: 1500 MIBK: 1500 | 19.0 | 511 | 65 | 0.0080 |

*Difference in refractive index between radical polymerization compound and cationic polymerization compound Examples 7 and 8

In these Examples, according to the same manner as that described in Examples 1 and 2 except for using no polymer binder P-1, a test was carried out to produce a transmission type hologram.

The composition of the photosensitive compositions for hologram recording used in Examples 7 and 8 and evaluation results of the hologram are shown in Table 3 below. In all Examples, practical transparent transmission type holograms were obtained.

TABLE 3

| | Composition of photosensitive composition (mg) | | | | | | Evaluation results of reflection type hologram | | | |
|---|---|---|---|---|---|---|---|---|---|---|
| Example No. | Cationic polymerizable compound having siloxane group | Radical polymerizable compound | Cationic photopolymerization initiating material | Radical photopolymerization initiating material | Difference in refractive index (*) | Solvent (mg) | Film thickness (μm) | Peak wavelength of diffraction light (nm) | Diffraction efficiency (%) | Refractive index modulation |
| 7 | TSL9906: 300 | AEPM: 1500 | TPS.SbF$_6$: 80 | DYE-1: 5 DPI.TF: 60 | 0.087 | BuOH: 1500 MIBK: 1500 | 8.4 | 531 | 28 | 0.0110 |
| 8 | XC96-B0370: 300 | AEPM: 1500 | TPS.SbF$_6$: 80 | DYE-1: 5 DPI.TF: 60 | 0.065 | BuOH: 1500 MIBK: 1500 | 9.0 | 545 | 36 | 0.0094 |

*Difference in refractive index between radical polymerization compound and cationic polymerization compound Examples 9 and 10

In these Examples, the test plate of the reflection type hologram obtained in Examples 3 and 4 was subjected to the light resistance test and heat resistance test.

The results are shown in Table 4 below.

TABLE 4

| Example No | Hologram to be tested | Results of light resistance test of hologram | | | Results of heat resistance test of hologram | | |
|---|---|---|---|---|---|---|---|
| | | Change in diffraction efficiency Before irradiation → After irradiation Amount of change | Change in diffraction peak wavelength Before irradiation → After irradiation Amount of change | Yellowing | Change in diffraction efficiency Before irradiation → After irradiation Amount of change | Change in diffraction peak wavelength Before irradiation → After irradiation Amount of change | Yellowing |
| 9 | Hologram of Example 3 | 97% → 94% −3% | 510 nm → 508 nm −2 nm | Slightly observed | 97% → 98% +1% | 510 nm → 495 nm −15 min | None |
| 10 | Hologram of Example 4 | 96% → 95% −1% | 512 nm → 511 nm −1 nm | Slightly observed | 96% → 98% +2% | 512 min → 498 nm −14 nm | None |

Comparative Examples 5 and 6

These are Comparative Examples, which illustrate that the light resistance and heat resistance of the test plate of the reflection type hologram produced by using a cationic polymerizable compound having no siloxane group are inferior to those of Examples 9 and 10.

The results are shown in Table 5.

TABLE 5

| Comparative Example No. | Hologram to be tested | Results of light resistance test of hologram | | | Results of heat resistance test of hologram | | |
|---|---|---|---|---|---|---|---|
| | | Change in diffraction efficiency Before irradiation → After irradiation Amount of change | Change in diffraction peak wavelength Before irradiation → After irradiation Amount of change | Yellowing | Change in diffraction efficiency Before irradiation → After irradiation Amount of change | Change in diffraction peak wavelength Before irradiation → After irradiation Amount of change | Yellowing |
| 5 | Hologram of Example 3 | 73% → 50% −23% | 509 nm → 494 nm −15 nm | Considerable yellowing | 73% → 63% −10% | 509 nm → 475 nm −34 nm | Observed |
| 6 | Hologram of Example 4 | 65% → 37% −28% | 511 nm → 487 nm −24 min | Considerable yellowing | 65% → 57% −8% | 511 nm → 480 nm −31 nm | Observed |

Examples 11 to 13

In these Examples, a reflection type hologram was produced using a compound having an acryloyl group as a radical polymerizable group, PS2A (structural formula will be described hereinafter) or a compound having a methacryloyl group as a radical polymerizable group, TSL9706 or TSL9705 (structural formulas of both compounds will be described hereinafter) as the radical polymerizable compound having a siloxane group, and using CAT-3 having a refractive index lower than that of PS2A or CAT-4 having a refractive index higher than TSL 9706 or TSL9705 as the cationic photopolymerizable compound having no siloxane group in combination therewith.

As the cationic polymerization initiating material, TPS•SbF6 was used. As the radical photopolymerization initiating material, a combination of DYE-1 with DPI•TF was used.

The composition of the photosensitive compositions for hologram recording used in Examples 11 to 13 and evaluation results of the hologram are shown in Table 6 below. In all Examples, practical transparent reflection type holograms were obtained.

TABLE 6

| Example No. | Composition of photosensitive composition (mg) | | | | | | Evaluation results of reflection type hologram | | | |
|---|---|---|---|---|---|---|---|---|---|---|
| | Radical polymerizable compound having siloxane group | Cationic polymerizable compound | Cationic photopolymerization initiating material | Radical photopolymerization initiating material | Polymer binder | Difference in refractive index (*) | Solvent (mg) | Film thickness (μm) | Peak wavelength of diffraction (nm) | Diffraction efficiency (%) | Refractive index modulation |
| 11 | PS2A: 900 | CAT-3: 900 | TPS·SbF$_6$: 80 | DYE-1: 5 DPI·TF: 60 | P-1: 350 | 0.021 | BuOH: 1500 MIBK: 1500 | 18.1 | 507 | 88 | 0.0132 |
| 12 | TSL9706: 900 | CAT-4: 900 | TPS·SbF$_6$: 80 | DYE-1: 5 DPI·TF: 60 | P-1: 350 | 0.150 | BuOH: 1500 MIBK: 1500 | 17.9 | 504 | 72 | 0.0097 |
| 13 | TSL9705: 900 | CAT-4: 900 | TPS·SbF$_6$: 80 | DYE-1: 5 DPI·TF: 60 | P-1: 350 | 0.174 | BuOH: 1500 MIBK: 1500 | 18.5 | 503 | 70 | 0.0090 |

*Difference in refractive index between radical polymerization compound and cationic polymerization compound Examples 14 to 16

In these Examples, the test plate of the reflection type hologram obtained in Examples 11 to 13 was subjected to the light resistance test and heat resistance test.

The results are shown in Table 7 below.

TABLE 7

| Example No | Hologram to be tested | Results of light resistance test of hologram | | | Results of heat resistance test of hologram | | |
|---|---|---|---|---|---|---|---|
| | | Change in diffraction efficiency Before irradiation → After irradiation Amount of change | Change in diffraction peak wavelength Before irradiation → After irradiation Amount of change | Yellowing | Change in diffraction efficiency Before irradiation → After irradiation Amount of change | Change in diffraction peak wavelength Before irradiation → After irradiation Amount of change | Yellowing |
| 14 | Hologram of Example 11 | 88% → 86% −2% | 507 nm → 505 nm −2 nm | None | 88% → 90% +2% | 507 nm → 498 nm −9 nm | None |
| 15 | Hologram of Example 12 | 72% → 68% −4% | 504 nm → 503 nm −1 nm | Slightly observed | 72% → 73% +1% | 504 nm → 497 nm −7 nm | None |
| 16 | Hologram of Example 13 | 70% → 67% −3% | 503 nm → 500 nm −3 nm | Slightly observed | 70% → 74% +4% | 503 nm → 495 nm −8 nm | None |

Example 17

In this Examples, a reflection type hologram was produced using PS2A as the radical polymerizable compound having a siloxane group, and using TSL9906 having a refractive index lower than that of PS2A as the cationic polymerizable compound having a siloxane group.

As the cationic photopolymerization initiating material, TPS·SbF$_6$ was used. As the radical photopolymerization initiating material, a combination of DYE-1 with DPI·TF was used.

The composition of the photosensitive compositions for hologram recording used in Example 17 and evaluation results of the hologram are shown in Table 8 below. A practical transparent reflection type hologram was obtained in all Examples.

TABLE 8

| Example No. | Composition of photosensitive composition (mg) | | | | | | | Evaluation results of reflection type hologram | | | |
|---|---|---|---|---|---|---|---|---|---|---|---|
| | Cationic polymerizable compound having siloxane group | Radical polymerizable compound having siloxane group | Cationic photopolymerization initiating material | Radical photopolymerization initiating material | Polymer binder | Difference in refractive index (*) | Solvent (mg) | Film thickness (μm) | Peak wavelength of diffraction light (nm) | Diffraction efficiency (%) | Refractive index modulation |
| 17 | TSL9906: 900 | PS2A: 900 | TPS.SbF$_6$: 80 | DYE-1: 5 DPI.TF: 60 | P-1: 350 | 0.038 | BuOH: 1500 MIBK: 1500 | 17.4 | 511 | 92 | 0.0154 |

*Difference in refractive index between radical polymerization compound and cationic polymerization compound

Example 18

In this Example, the test plate of the reflection type hologram obtained in Example 17 was subjected to the light resistance test and heat resistance test.

The results are shown in Table 9 below.

TABLE 8

| Example No | Hologram to be tested | Results of light resistance test of hologram | | | Results of heat resistance test of hologram | | |
|---|---|---|---|---|---|---|---|
| | | Change in diffraction efficiency Before irradiation → After irradiation Amount of change | Change in diffraction peak wavelength Before irradiation → After irradiation Amount of change | Yellowing | Change in diffraction efficiency Before irradiation → After irradiation Amount of change | Change in diffraction peak wavelength Before irradiation → After irradiation Amount of change | Yellowing |
| 18 | Hologram of Example 17 | 92% → 90% −2% | 511 nm → 508 nm −3 nm | None | 92% → 94% +2% | 511 nm → 507 nm −4 nm | None |

Example 19

In this Example, the same photosensitive composition as that of Example 1 was subjected to the first exposure and post exposure according the same manner as that described in Example 1, followed by subjecting to a heat treatment at 100° C. for 30 minutes to produce a reflection type hologram. The composition and results are shown in Table 10 below.

TABLE 10

| Example No. | Composition of photosensitive composition (mg) | | | | | | | Evaluation results of reflection type hologram | | | |
|---|---|---|---|---|---|---|---|---|---|---|---|
| | Cationic polymerizable compound having siloxane group | Radical polymerizable compound | Cationic photopolymerization initiating material | Radical photopolymerization initiating material | Polymer binder | Difference in refractive index (*) | Solvent (mg) | Film thickness (μm) | Peak wavelength of diffraction (nm) | Diffraction efficiency (%) | Refractive index modulation |
| 19 | TSL9906: 300 | AEPM: 1500 | TPS.SbF$_6$: 80 | DYE-1: 5 DPI.TF: 60 | P-1: 500 | 0.087 | BuOH: 1500 MIBK: 1500 | 17.0 | 500 | 97 | 0.0198 |

*Difference in refractive index between radical polymerization compound and cationic polymerization compound The compounds (shown by abbreviations) used in the above Examples, Comparative Examples and Tables are as follows.

Cationic polymerizable compound having siloxane group
[TSL9906]

Refractive index: 1.452

Trade name: TSL9906, manufactured by Toshiba Silicone Co., Ltd.

Compound having the following structure:

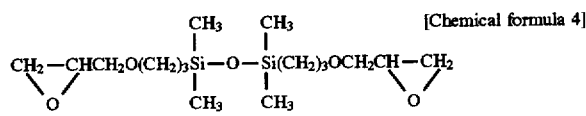
[Chemical formula 4]

[XC96-B0370]

Refractive index: 1.474

Trade name: XC96-B0370, manufactured by Toshiba Silicone Co., Ltd.

Compound having the following structure:
[Chemical formula 5]

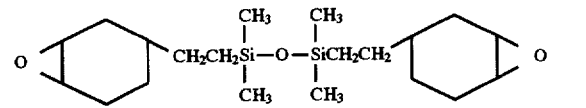

Radical polymerizable compound having no siloxane group
[AEPM]

Refractive index: 1.539

Trade name: R712, manufactured by Nihon Kayaku Co., Ltd.

Bis(4-acryloxydiethoxyphenyl)methane
[A-BPHE]

Refractive index: 1.587

9,9'-Bis(3-ethyl-4-acryloxydiethoxyphenyl)fluorene

Radical polymerizable compound having siloxane group
[PS2A]

Refractive index: 1.490

Compound having the following structure:

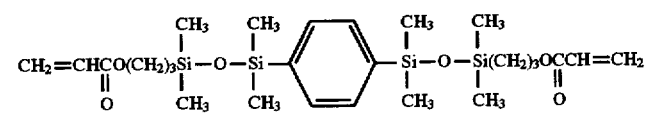
[Chemical formula 6]

[TSL9706]

Refractive index: 1.451

Trade name: TSL9706, manufactured by Toshiba Silicone Co., Ltd.

Compound having the following structure:

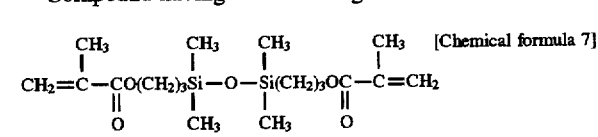
[Chemical formula 7]

[TSL9705]

Refractive index: 1.427

Trade name: TSL9705, manufactured by Toshiba Silicone Co., Ltd.

Compound having the following structure:

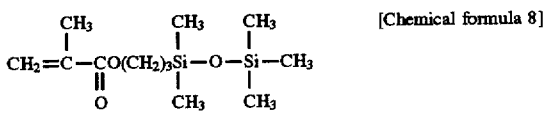
[Chemical formula 8]

Cationic polymerizable compound
[CAT-1]

Refractive index: 1.462

Trade name: DENACOL EX-211, manufactured by Nagase Kasei Kogyo Co., Ltd.

Neopentyl glycol diglycidyl ether
[CAT-2]

Refractive index: 1.498

Trade name: UVR6110, manufactured by Union Carbide Co.

3,4-Epoxycyclohexylmethyl-3',4'-epoxycyclohexane carboxylate
[CAT-3]

Refractive index: 1.469

Glycidyl ether wherein 4 mols of propylene oxide is added to pentaerythritol (having three glycidyl groups per one molecule)
[CAT-4]

Refractive index: 1.601

Trade name: DENACOL EX-147, manufactured by Nagase Kasei Kogyo Co., Ltd.

Dibromophenyl glycidyl ether
Cationic photopolymerization initiating material
[TPS·SbF$_6$]

Trade name: UVI-6974, manufactured by Ciba Geigy Co.

Triaryl sulfonium hexafluoroantimonate compound
Radical photopolymerization initiating material
[DYE-1]

3,9-Diethyl-3'-carboxymethyl-2,2'-thiacarbocyanine iodide
[DPI·TF]

Diphenyl iodonium trifluoromethanesulfonate

Polymer binder
[P-1]

Methyl methacrylate/ethyl acrylate/acrylic acid copolymer (copolymerization ratio=45/49/6)
Other components
Solvent
[BuOH]: n-Butyl alcohol
[MIBK]: Methyl isobutyl ketone

We claim:

1. A photosensitive composition for volume hologram recording, which is used for recording interference fringes produced by the interference of a laser beam or a light having excellent coherence as fringes having different refractive indices, said composition comprising the following components:

(A) a cationic polymerizable compound and a radical polymerizable compound, (B) a cationic polymerization initiating material, and
(C) a radical polymerization initiating material, wherein at least one of the cationic polymerizable compound and radical polymerizable compound have a siloxane group and are represented by the following:

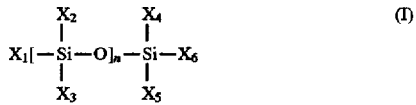
(I)

wherein at least one of $X_1$ to $X_6$ has a cationic polymerizable group at the terminal end and the remaining of $X_1$ to $X_6$ are the same or different and indicate a hydrogen atom, an alkyl group having 1 to 4 carbon atoms, an alkoxy group having 1 to 4 carbon atoms, a dialkylamino group, a phenyl group or a hydroxyl group; and n is an integer of 1 to 7, and

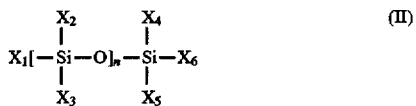
(II)

wherein at least one of $X_1$ to $X_6$ has a radical polymerizable group at the terminal end and the remaining of $X_1$ to $X_6$ are the same or different and indicate a hydrogen atom, an alkyl group having 1 to 4 carbon atoms, an alkoxy group having 1 to 4 carbon atoms, a dialkylamino group, a phenyl group or a hydroxyl group; and n is an integer of 1 to 7.

2. A photosensitive composition for volume hologram recording of claim 1, in which the polymerizable group and the silicon atom of the cationic polymerizable compounds or the radical polymerizable compounds are bound through an alkylene chain, an oxyethylene chain, an oxypropylene chain, a urethane chain or an amide chain.

3. The photosensitive composition for volume hologram recording of claim 1, in which the cationic polymerizable group are selected from the group consisting of a glycidyl group, a cyclic ether, a cyclic sulfide, a cyclic imine, a cyclic disulfide, a lactone, a lactam, a cyclic formal, a cyclic imino ether and a vinyl ether.

4. The photosensitive composition for volume hologram recording of claim 1, in which the radical polymerizable group contains an ethylenically unsaturated double bond.

* * * * *